United States Patent [19]

Yoshio et al.

[11] Patent Number: 4,920,398
[45] Date of Patent: Apr. 24, 1990

[54] SEMICONDUCTOR MIS INTEGRATED CIRCUIT DEVICE

[75] Inventors: Shintani Yoshio, Kokubungi; Inatsu Mikio, Mitaka, both of Japan

[73] Assignees: Hitachi, Ltd.; Hitachi Microcomputer Engineering Ltd., both of Tokyo, Japan

[21] Appl. No.: 363,835

[22] Filed: Jun. 9, 1989

[30] Foreign Application Priority Data

Jun. 29, 1988 [JP] Japan .................. 63-162156

[51] Int. Cl.$^5$ .................................... H01L 27/02
[52] U.S. Cl. ................................................ 357/42
[58] Field of Search .................................. 357/41, 42

[56] References Cited
U.S. PATENT DOCUMENTS 4,668,972  5/1987  Sato et al. ........................... 357/42
4,682,201  7/1987  Lipp ..................................... 357/42
4,682,202  7/1987  Tanizawa ............................. 357/42
4,766,475  8/1988  Kawashima ......................... 357/42

Primary Examiner—Gene M. Munson
Attorney, Agent, or Firm—Pennie & Edmonds

[57] ABSTRACT

In an oscillation circuit consisting of an amplification circuit portion composed of transistors of input/output circuit basic cells of a gate array disposed on a semiconductor pellet and an oscillator disposed outside the semiconductor pellet, the amplification circuit portion consists of transistors for an output circuit of the input-/output buffer circuit basic cells. The dielectric breakdown characteristics of the amplification circuit portion of the oscillation circuit can be improved because the structure of the transistor for the output circuit is more highly resistant to dielectric breakdown than the structure of the transistor for the input circuit.

8 Claims, 5 Drawing Sheets

SEMICONDUCTOR MIS INTEGRATED CIRCUIT DEVICE

BACKGROUND OF THE INVENTION

This invention relates generally to a semiconductor integrated circuit device, and more particularly to a technique which will be useful when applied to a semiconductor integrated circuit device formed by a master slide approach such as a gate array.

The gate array is described, for example, in "Nikkei Microdevices", published by Nikkei McGraw-Hill Co., September issue, 1986, pp. 65-80. This reference explains CMOS (Complementary MOS) gate arrays having higher functions.

The gate array approach can form various many logic functions and memory functions by changing a wiring pattern to be applied to a master wafer. This change of the wiring pattern or the change of a circuit specification is decided in accordance with user's requirements.

An oscillation circuit used as a reference clock generation circuit of a microcomputer interface portion, for example, consists of basic cells for two adjacent input-/output buffer circuits (I/O cells) and a crystal oscillator connected to each of bonding pads (hereinafter referred to as the "pad or pads") corresponding to the I/O cells.

A typical structure of this oscillation circuit is shown in FIG. 5 of the accompanying drawings. In this case, an inverter circuit 25 for oscillation as an amplification circuit portion of the oscillation circuit is composed of transistors having the same structure as those of an internal cell array region, that is, the transistors of an input circuit device region 26 for which any measures for electrostatic discharge damage are not made on the ground that a sufficient amplification effect can be obtained even though the transistors are small in size.

Recently, the amplification circuit described above is composed of a CMOS circuit because its power consumption is small.

SUMMARY OF THE INVENTION

However, the inventor of the present invention has found out that the following problems exist in the prior art technique described above which constitutes the amplification circuit of the oscillation circuit by use of the transistors of the input circuit device region.

A protective resistor is connected to the input side of the inverter circuit for oscillation as the amplification circuit portion but a protective resistor cannot be connected to its output side because an output impedance must be kept at a low level and the gain of the amplification circuit must be increased. Even if it can be connected, only a protective resistor having a value of some dozens of ohms can be employed.

Accordingly, the prior art technique which constitutes the oscillation inverter circuit by use of the transistors of the input circuit device region which are not highly resistant to electrostatic discharge damage structurally cannot withstand an excessive voltage (or current) when such a voltage (current) is applied thereto from the output side of the oscillation inverter circuit not equipped with any protective resistor. If the transistor is of the MOS type, for example, its gate insulation film undergoes didelectric breakdown and the transistor becomes inoperative.

If the transistor has the CMOS structure, the following problem develops.

The CMOS structure of the output circuit device region of I/O cell consists of those transistors which are greater than the transistors of the input circuit device region of the I/O cell in order to increase the driving capacity of an external device and is therefore resistant to latch-up but the CMOS structure of the input circuit device region of the I/O cell is the same structure as the CMOS structure of a miniaturized internal cell array region or in other words, its resistance to latch-up is lower than that of the CMOS structure of the output circuit device region.

Accordingly, if the voltage on the output side of the oscillation inverter is higher than the power source voltage in the circuit due to the noise entering from the output side or to a trigger current of over-shoot or under-shoot, for example, latch-up takes place. If this latch-up occurs, wirings are fused and the heat generated at this time will cause breakage of semiconductor devices and the package which stores a semiconductor pellet.

In view of the problems with the prior art technique described above, the present invention is directed to provide a technique which can improve resisting characteristics to electrostatic discharge damage of an amplification circuit portion of an oscillation circuit consisting of I/O cells of a gate array and an oscillator.

It is another object of the present invention to provide a technique which can improve latch-up characteristics of the amplification circuit portion of the oscillation circuit consisting of the I/O cells of the gate array and the oscillator when the amplification circuit is composed of a CMOS circuit.

The above and other objects, novel features and advantages of the present invention will become more apparent from the following description when taken in conjunction with the accompanying drawings.

Among the inventions disclosed in this application, the following will illustrate briefly a typical example.

In a semiconductor integrated circuit device equipped with an oscillation circuit consisting of an amplification circuit composed of MISFETs inside an I/O cell disposed on a semiconductor pellet and an oscillator disposed outside the semiconductor pellet, the amplification circuit is composed of MISFETs for an output circuit inside the I/O cell.

The amplification circuit of the oscillation circuit is also composed of a CMOS circuit.

According to the means described above, its dielectric breakdown characteristics can be improved because the amplification circuit portion of the oscillation circuit is composed of transistors for the output circuit which are structurally more resistant to dielectric breakdown than the transistors for an input circuit.

Furthermore, since the amplification circuit of the oscillation circuit consists of a CMOS circuit which requires less power consumption and moreover, since this CMOS circuit is composed of the MOS transistors for the output circuit which are structurally more resistant to dielectric breakdown and to latch-up than the CMOS circuit composed of the transistors for the input circuit, its latch-up resistance can be improved, too.

DESCRIPTION OF THE PREFERRED EMBODIMENTS

Figure 1:
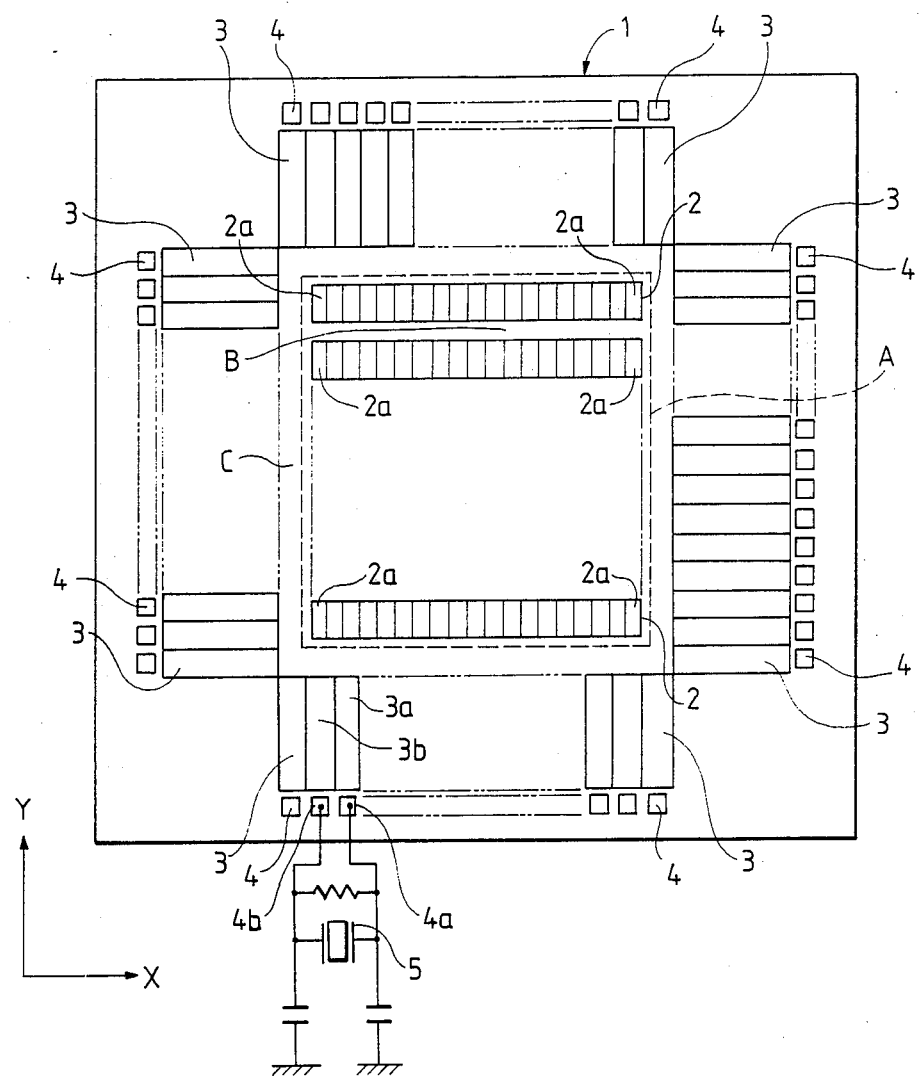
FIG. 1 is a schematic plan view of a gate array in an embodiment of the present invention.
Figure 2:
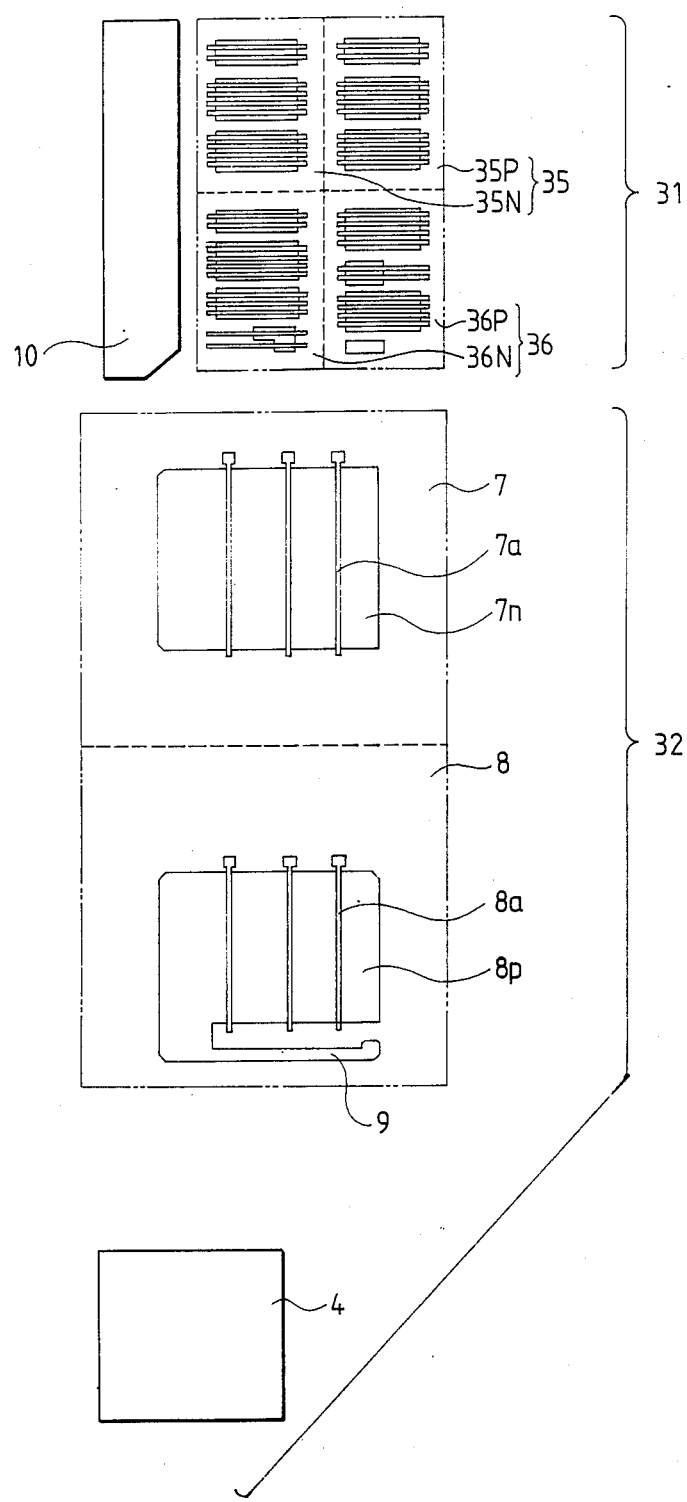
FIG. 2 is a plan view of I/O cells formed in I/O cell formation regions of the gate array.
Figure 3:
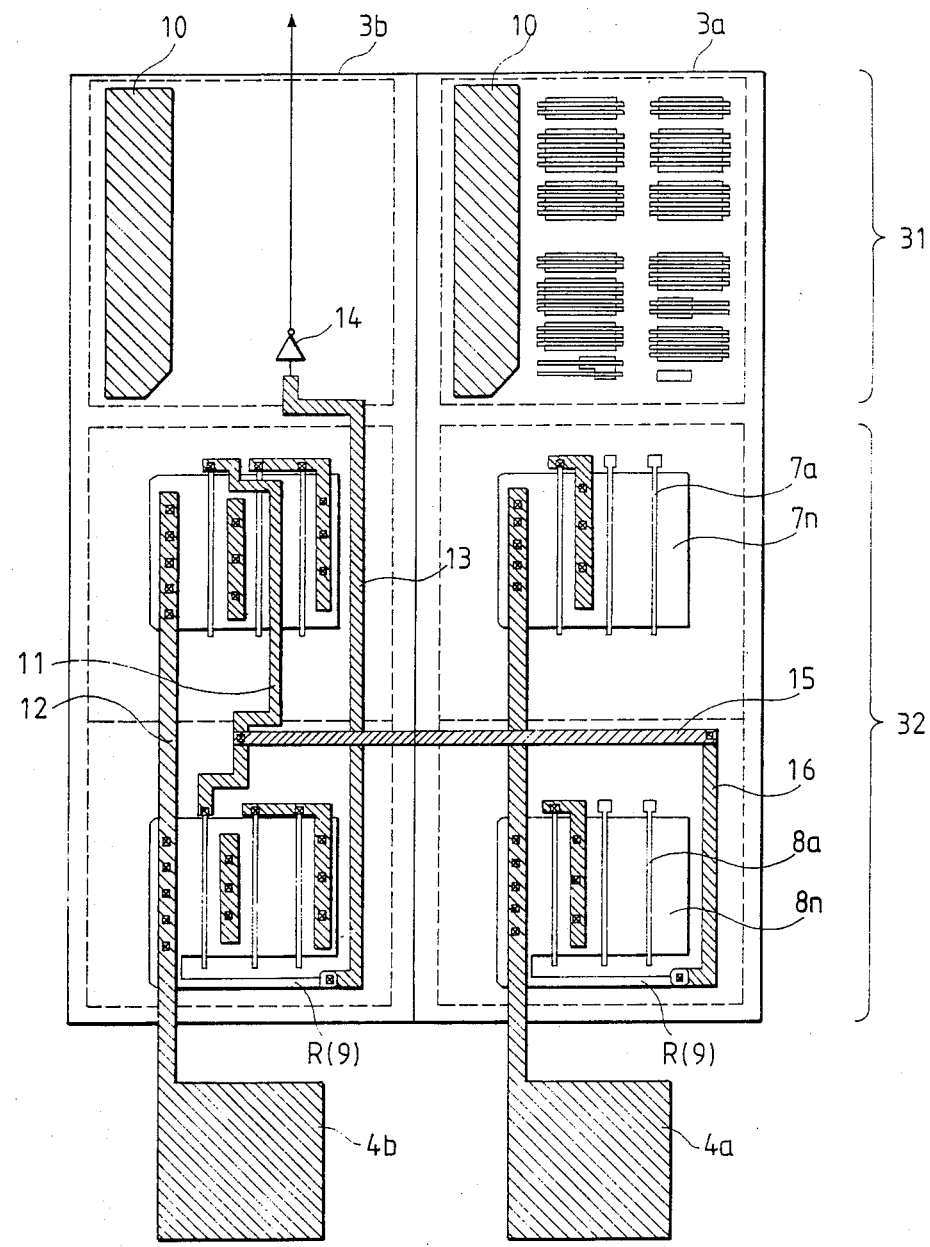
FIG. 3 is a plan view of an amplification circuit portion of an oscillation circuit of the gate array in one embodiment of the present invention.

FIG. 1 is a schematic plan view of a semiconductor integrated circuit device in accordance with one embodiment of the present invention, FIG. 2 is a schematic enlarged plan view of I/O cells formed in its I/O cell formation regions and FIG. 3 is a plan view of an oscillation circuit of this semiconductor integrated circuit device formed by the I/O cells.

The semiconductor device in this embodiment is a CMOS gate array and the semiconductor pellet 1 shown in FIG. 1 consists of a device formation layer and a wiring layer.

An internal cell array region A is disposed at the center of the pellet 1.

A plurality of stages of basic cell lines 2 spaced apart from one another by internal wiring regions B are disposed inside the internal cell array region A in the direction of a Y-axis in FIG. 1.

A plurality of basic cells 2a are arranged in the direction of an X-axis in FIG. 1 in each basic cell line 2. A plurality of pairs of N-channel MOS transistors having the same size and the same performance and a plurality of pairs of P-channel MOS transistors having the same size and the same performance are formed in each basic cell 2a, though they are not shown in the drawing.

Some dozens of aluminum wirings can be disposed on a primer field $SiO_2$ film in the internal wiring region B between the basic cell lines.

Each predetermined logic circuit (not shown) required by a user is formed by connecting the N-and P-channel MOS transistors of the basic cells 2a and logic cells formed inside each basic cell line 2 by signal wirings and power source wirings that are formed in the wiring layer and not shown in the drawing.

An external wiring region C is disposed around the outer periphery of the internal cell array region A and a plurality of I/O cells constituting an input/output buffer circuit are disposed around the external wiring region C in such a manner as to extend in both X and Y axis directions.

The input/output buffer circuit is the one that establishes matching between the logic circuit of the internal cell array region A and an external signal, for example, and protects the devices of the internal cell array region A from a noise.

A pad 4 having a predetermined size is disposed around the outer periphery of each I/O cell 3. A lead terminal (not shown) of a package for storing the pellet 1 is connected to each pad 4 through a bonding wire (not shown).

A quartz oscillator 5 is connected between the pads 4a and 4b and this quartz oscillator 5 and two I/O cells 3a, 3b corresponding to these pads 4a, 4b constitute an oscillation circuit.

As shown in FIG. 2, each I/O cell 3 consists of a first cell formation region 31 and a second cell formation region 32. The first cell formation region 31 is disposed on the side of the cell array region A and the second cell formation region 32 having a greater area than the former is disposed outside the cell array region A.

An output buffer plays the roles of inputting an electric signal from an internal circuit having small electric driving capacity, amplifying power so that a large electric load outside the semiconductor device can be driven sufficiently, and protecting the integrated circuit device from external surge noise. Circuit devices of this output buffer circuit consist of MOSs having a large driving capacity or having a large W/L (gate width/gate length) ratio because capacitance of the output bonding pads must be charged and discharged. Accordingly, the circuit devices of the output circuit are greater than those of the input circuit. For this reason, the circuit devices for the input circuit are formed in the first cell formation region 31 while the circuit devices for the output circuit which are greater than those for the input circuit are formed in the second cell formation region 32.

As shown in FIG. 2, a PMOS region 35p for a pre-buffer circuit, a PMOS region for the input circuit 36p (hereinafter referred to as the "input PMOS"), an NMOS region 35N for the pre-buffer circuit and an NMOS region 36N for the input circuit (hereinafter referred to as the "input NMOS") are disposed in the first cell formation region 31.

On the other hand, an NMOS region 7 for the output circuit (hereinafter referred to as the "output NMOS") is disposed on the side of the first cell formation region 31 inside the second cell formation region 32 and a protective resistor 9 is formed on the side of the bonding pad 4. A PMOS region 8 for the output circuit (hereinafter referred to as the "output PMOS") is disposed between this protective resistor 9 and the output NMOS region 7.

The circuit devices of the I/O cell formation region 3 are connected by the wirings and constitute various circuit functions such as the input buffer circuit, the output buffer circuit, the amplification circuit of the oscillation circuit in this embodiment, and so forth.

The above-mentioned PMOS and NMOS for the pre-buffer circuit are connected only when the I/O cell is used as the output buffer for matching the signal phases so that the signal from inside can be adapted to external devices.

The region 10 in FIG. 2 is the remaining space 35 which can be secured to form the first cell formation region 31 corresponding to the second cell formation region 32 for forming the MOS for the output circuit and in which the circuit devices are formed. When the number of I/O cells corresponding to the internal cell array increases, the first and second cell formation regions 31 and 32 are separated by the wiring regions and the second cell formation regions 32 corresponding to the increment of the number of the first cell formation region 31 are formed at four corner portions of the semiconductor pellet 1, though not shown in the drawing, the spaces that can be secured for forming the first cell formation regions 31 are different between the center of each side of the chip outer periphery and at its end portion. Accordingly, the width of the region 10, too, is different between the center of each side of the chip outer periphery and at its end portion or the width is great at the center and drops progressively towards the end portion. Particularly at the extreme end portion, the region 10 itself does not exist at times. The width of the second cell formation region 32 is constant between the center of each side of the chip outer periphery and at its end due to the limitation of the bonding pads.

The region 10 is buried by a diffusion layer and an Al pattern and is used for fixing the potential of a well in which the MOS for the input circuit is formed, for a guard ring of the input circuit, and the like.

Figure 4:
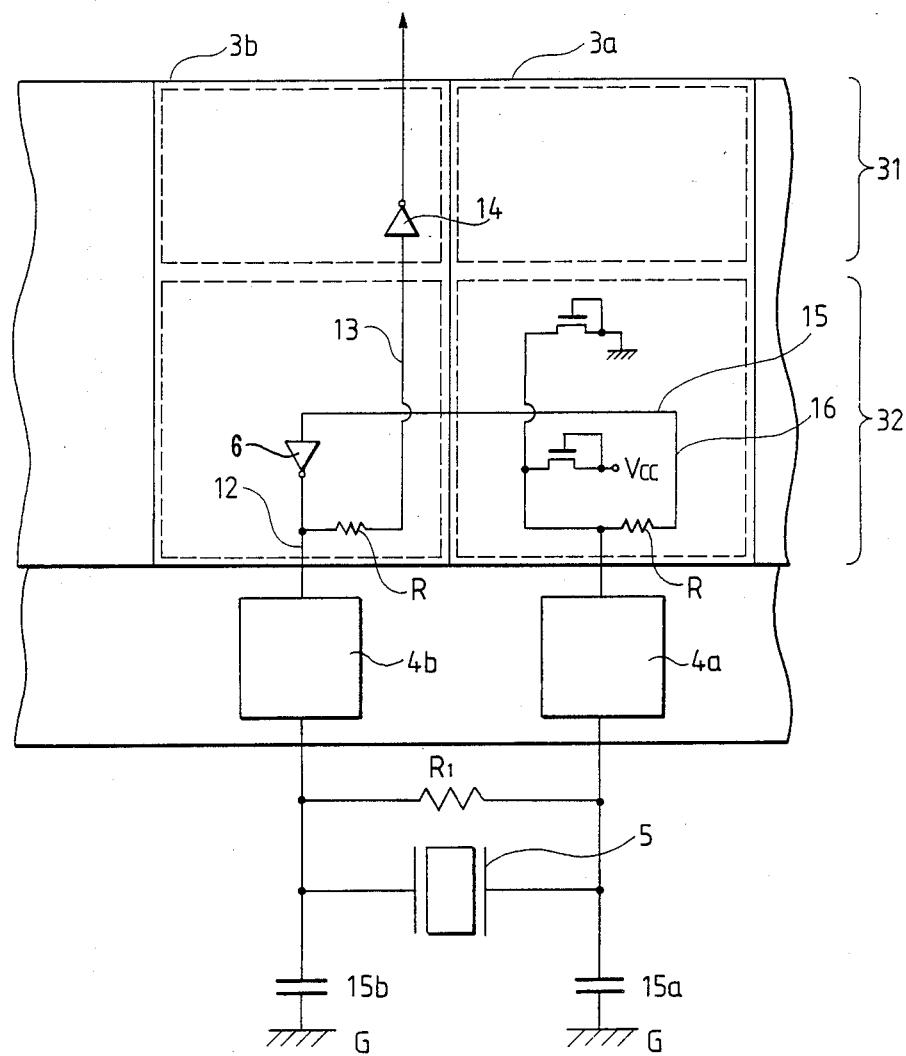
FIG. 4 is a circuit diagram of the oscillation circuit including the amplification circuit shown in FIG. 3.
Figure 5:
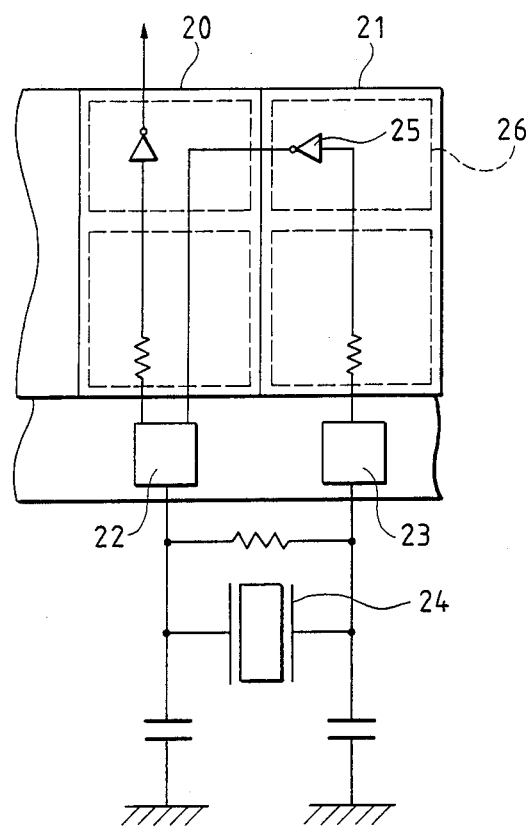
FIG. 5 is a circuit diagram of the oscillation circuit in a conventional gate array.

FIG. 3 is a plan view of the I/O cells 3a, 3b produced by applying wirings for forming the oscillation circuit to the I/O cells shown in FIG. 2 and FIG. 4 is its equivalent circuit diagram. In the drawings, regions with oblique lines represent a first layer aluminum wiring and a second layer aluminum wiring. The first layer aluminum wiring includes the wirings 11, 12, 13 and 16 for constituting the amplification circuit inside the I/O cell 3. Furthermore, lower layer of the bonding pads 4a, 4b, too, is composed of the first layer aluminum. The wiring 15, the upper layer of the bonding pads 4a, 4b and the power source wiring ($V_{cc}$, GND) for the I/O cell 3, not shown, is composed of the second layer aluminum wiring. As described already, the I/O cells 3a and 3b are composed of the first cell formation region 31 in which the input circuit devices are formed and the second cell formation region 32 in which the output circuit devices are formed, respectively.

Since the output NMOS and the output PMOS are greater in size than the input NMOS and the input MPOS, they are highly resistant to dielectric breakdown. Furthermore, since the output NMOS and the output PMOS are spaced apart sufficiently from one another, these transistors are also resistant to latch-up.

Each output NMOS is composed of a gate electrode 7a consisting of poly-silicon and an N+ diffusion layer formed by implanting and diffusing an N-type impurity.

Each output PMOS is composed of a gate electrode 8a consisting of poly-silicon and a P+ diffusion layer 8p formed by implanting and diffusing a P-type impurity.

In this embodiment the gate electrode 7a of the output NMOS and the gate electrode 8a of the output PMOS are connected by the wiring 11 and the N+ diffusion layer 7n of the output NMOS and the P+ diffusion layer of the output PMOS are connected by the wiring 12, thereby forming an inverter circuit for oscillation by a CMOS circuit.

The wiring 11 is the input wiring of the inverter circuit 6 for oscillation and is connected to the pad 4a through the protective resistor R for the I/O cell 3a and through the wirings 16 and 5.

The wiring 12 is the output wiring of the inverter circuit 6 for oscillation, is connected to the pad 4b and is further connected to the inverter circuit 14 consisting of the MOS for the input circuit of the first cell formation region 31, through the protective resistor R of the I/O cell 3b and through the wiring 13. The other aluminum wirings of the first layer shown in FIG. 3 are for cutting off MOSs other than those MOSs which are used for the inverter circuit 6 for oscillation formed in the second cell formation region 32 of each I/O cell 3a, 3b.

Next, the structure of the oscillation circuit will be explained with reference to FIG. 4.

Capacitors 15a and 15b are connected in series, respectively, between the reference potential G and the pads 4a, 4b connected respectively to the input/output terminals of the inverter circuit 6 for oscillation formed in the second formation region 31.

A resistor R and a quartz oscillator 5 for positive feedback are connected in parallel between the pads 4a and 4b to form the oscillation circuit.

The clock signal oscillated from the inverter circuit 6 for oscillation is transferred to the internal cell array region A from the pad 4b through the protective resistor R of the I/O cell 3b and through the inverter circuit 14.

According to this embodiment, the inverter circuit 6 for oscillation as the amplification circuit portion of the oscillation circuit consists of the output NMOS and output PMOS having a strong structure to dielectric breakdown, and the dielectric breakdown characteristics of the inverter circuit 6 for oscillation can therefore be improved.

The inverter circuit 6 for oscillation consisting of the CMOS circuit requires less power consumption and moreover, its latch-up resistance can be improved because it consists of the CMOS circuit formed in the output circuit device region F having higher resistance to latch-up than the CMOS circuit formed in the input circuit device region E.

Since the inverter circuit 6 for oscillation consists of the output NMOS and output PMOS, the driving capacity can be improved in comparison with the conventional inverter circuit consisting of the input NMOS and input PMOS, and the circuit can be used for the oscillation of a higher frequency than the conventional inverter circuit for oscillation by connecting in parallel a plurality of transistors.

The following illustrates the effects obtained by the typical invention disclosed in this application.

In the gate array equipped with the oscillation circuit consisting of the amplification circuit portion composed of the transistors of the input/output circuit cells disposed on the semiconductor pellet and the oscillator disposed outside the semiconductor pellet, the amplification circuit portion is composed of the transistors for the output circuit so that the resistance of the amplification circuit portion of the oscillation circuit to dielectric breakdown can be improved because the structure of the transistors for the output circuit is more highly resistant to the structure of the transistors for the input circuit.

The amplification circuit portion consisting of the CMOS circuit needs less power consumption and its dielectric breakdown resistance as well as latch-up resistance can be improved because its CMOS circuit consists of the MOS transistors for the output circuit which are more highly resistant structurally to them than the CMOS circuit consisting of the transistors for the input circuit.

Although the present invention has thus been described definitely with reference to some embodiments thereof, the invention is not particularly limited thereto but can of course be changed or modified in various manners without departing from the spirit and scope thereof.

For example, though the foregoing embodiments use the quartz oscillator as the oscillator, the oscillator is not particularly limited thereto but can be changed or modified in various manners such as a ceramic oscillator, for example.

Though the inverter circuit for oscillation consists of the P-channel MOS transistors and the N-channel MOS transistors it is not particularly limited thereto but can be changed or modified in various manners. For example, it is possible to use bipolar transistors. In this case, breakdown of the bipolar transistors due to an excessive voltage (current) such as static electricity can be prevented. It is only necessary that the inverter for oscillation be compose of the transistors for the output circuit. Therefore, the mode of arrangement of the transistors for the input and output circuits in the I/O cell, the mode of connection of the wirings inside the I/O cell, and the like, are not particularly limited to those described in the foregoing embodiments. The present invention can be applied to other semiconductor integrated circuit devices such as a gate array mounted to a standard cell or one chip microcomputer, and the like.

What is claimed is:

1. A semiconductor integrated circuit device comprising:
   a semiconductor pellet;
   a rectangular internal cell array consisting of a plurality of basic cell lines each being formed by arranging a plurality of basic cells formed on said semiconductor pellet and juxtaposed in the same direction;
   a plurality of basic cells for input/output buffer circuits disposed in the outer peripheral direction of said internal cell array and including MISFETs for output circuit for forming an output circuit and MISFETs for input circuit for forming an input circuit;
   external terminals disposed in such a manner as to correspond to said basic cells for the input/output buffer circuits and to be positioned more outward than said basic cells for the input/output buffer circuits;
   an oscillator disposed outside said semiconductor pellet; and
   an oscillation circuit consisting of said oscillator and said MISFETs for said output circuit, with said MISFETs for said output circuit forming an amplification circuit portion of said oscillation circuit.

2. A semiconductor integrated circuit device according to claim 1, wherein said MISFET for said output circuit has a greater ratio of a gate width/gate length than said MISFET for said input circuit.

3. A semiconductor integrated circuit device according to claim 1, wherein said oscillation circuit consists of two adjacent basic cells for the input/output buffer, circuits among said plurality of basic cells for the input/output buffer circuit, said external terminals corresponding to said two basic cells, capacitors disposed between said external terminals and a reference potential disposed outside said pellet, and a resistor and -an oscillator that are disposed between said external terminals.

4. A semiconductor integrated circuit device according to claim 1, wherein said amplification circuit portion of said oscillation circuit has an inverter for oscillation using said MISFET for said output circuit.

5. A semiconductor integrated circuit device according to claim 4, wherein said MISFETs for said output circuit consist of P-channel MISFET and N-channel MISFET.

6. A semiconductor integrated circuit device according to claim 1, wherein said MISFETs for said output circuit and said MISFETs for said input circuit consist of P-channel MISFETs and N-channel MISFETs, respectively.

7. A semiconductor integrated circuit device according to claim 1, wherein said semiconductor integrated device is fabricated by a master slice system.

8. A semiconductor integrated circuit device according to claim 1, wherein said MISFET for said output circuit has greater driving capacity than said MISFET for said input circuit.

* * * * *